(12) United States Patent  (10) Patent No.: US 8,390,018 B2
Jang  (45) Date of Patent: Mar. 5, 2013

(54) NITRIDE-BASED COMPOUND SEMICONDUCTOR LIGHT EMITTING DEVICE AND METHOD OF FABRICATING THE SAME

(75) Inventor: Tae-hoon Jang, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 164 days.

(21) Appl. No.: 11/448,831

(22) Filed: Jun. 8, 2006

(65) Prior Publication Data

US 2007/0023775 A1  Feb. 1, 2007

(30) Foreign Application Priority Data

Jul. 30, 2005 (KR) .................. 10-2005-0070030

(51) Int. Cl.
*H01L 33/00* (2010.01)
(52) U.S. Cl. ... 257/99; 257/245; 257/249; 257/E51.018; 257/E51.019; 257/E51.022; 257/E33.001; 257/E33.023; 257/E33.034; 257/E33.066; 438/650; 438/686
(58) Field of Classification Search .................. None
See application file for complete search history.

(56) References Cited

U.S. PATENT DOCUMENTS

| | | | | |
|---|---|---|---|---|
| 5,563,422 | A * | 10/1996 | Nakamura et al. | 257/13 |
| 5,990,500 | A * | 11/1999 | Okazaki | 257/99 |
| 6,281,526 | B1 * | 8/2001 | Nitta et al. | 257/103 |
| 6,387,726 | B1 * | 5/2002 | Verlinden et al. | 438/98 |
| 6,445,011 | B1 * | 9/2002 | Hirano et al. | 257/99 |
| 6,737,678 | B2 * | 5/2004 | Kawakami et al. | 257/79 |
| 7,183,586 | B2 * | 2/2007 | Ichihara et al. | 257/98 |
| 2001/0006254 | A1 * | 7/2001 | Li | 257/742 |
| 2002/0020843 | A1 * | 2/2002 | Uemura | 257/81 |
| 2003/0062534 | A1 * | 4/2003 | Hata et al. | 257/99 |
| 2004/0000672 | A1 * | 1/2004 | Fan et al. | 257/79 |
| 2004/0026701 | A1 * | 2/2004 | Murai et al. | 257/79 |

(Continued)

FOREIGN PATENT DOCUMENTS

JP  10-294531  11/1998
JP  11-274562 A  10/1999

(Continued)

OTHER PUBLICATIONS

Japan Patent Office, Non-final Rejection, Application No. 2006-208638, dated Sep. 6, 2011.

*Primary Examiner* — Fernando L Toledo
*Assistant Examiner* — Yasser Abdelaziez
(74) *Attorney, Agent, or Firm* — Kile Park Goekjian Reed & McManus PLLC

(57) ABSTRACT

A nitride-based semiconductor light emitting device with improved characteristics of ohmic contact to an n-electrode and a method of fabricating the same are provided. The nitride-based semiconductor light emitting device includes an n-electrode, a p-electrode, an n-type compound semiconductor layer, and an active layer and a p-type compound semiconductor layer formed between the n- and p-electrodes. The n-electrode includes: a first electrode layer formed of at least one element selected from the group consisting of Pd, Pt, Ni, Co, Rh, Ir, Fe, Ru, Os, Cu, Ag, and Au; and a second electrode layer formed on the first electrode layer using a conductive material containing at least one element selected from the group consisting of Ti, V, Cr, Zr, Nb, Hf, Ta, Mo, W, Re, Ir, Al, In, Pb, Ni, Rh, Ru, Os, and Au.

14 Claims, 4 Drawing Sheets

| U.S. PATENT DOCUMENTS | | | |
|---|---|---|---|
| 2004/0062282 A1* | 4/2004 | Matsuoka et al. | 372/26 |
| 2004/0077135 A1* | 4/2004 | Fan et al. | 438/200 |
| 2004/0159836 A1* | 8/2004 | Sugimoto et al. | 257/40 |
| 2004/0189173 A1* | 9/2004 | Chowdhury et al. | 313/309 |
| 2004/0195579 A1* | 10/2004 | Sonobe | 257/99 |
| 2005/0029536 A1* | 2/2005 | Sugitatsu et al. | 257/103 |
| 2005/0056865 A1* | 3/2005 | Tsuchiya et al. | 257/202 |

| FOREIGN PATENT DOCUMENTS | | |
|---|---|---|
| JP | 2000-277802 A | 10/2000 |
| JP | 2004-274042 | 9/2004 |
| JP | 2004-349595 | 12/2004 |
| JP | 2005-108982 | 4/2005 |

\* cited by examiner

NITRIDE-BASED COMPOUND SEMICONDUCTOR LIGHT EMITTING DEVICE AND METHOD OF FABRICATING THE SAME

CROSS-REFERENCE TO RELATED PATENT APPLICATION

This application claims the benefit of Korean Patent Application No. 10-2005-0070030, filed on Jul. 30, 2005, in the Korean Intellectual Property Office, the disclosure of which is incorporated herein in its entirety by reference.

BACKGROUND OF THE DISCLOSURE

1. Field of the Disclosure

The present disclosure relates to a nitride-based compound semiconductor device and a method of fabricating the same, and more particularly, to a nitride-based compound semiconductor device having improved characteristics of ohmic contact to an n-electrode and a method of fabricating the same.

2. Description of the Related Art

Laser diodes (LDs) or light-emitting diodes (LEDs) are commonly known as nitride-based semiconductor light emitting devices. LEDs are semiconductor devices that emit light of specific wavelength as electrons move from a high energy to low energy level when electricity is applied. LEDs are widely used in various applications to create light such as green light on the mother board when a hard disc spins, light on an electronic display board installed at buildings, or blinking light on a cellular phone. The LEDs have emerged as new light-emitters that provide about $\frac{1}{12}$ the power consumption, more than 100 times the life span, and more than 1,000 times the reaction rate to electricity when compared to conventional bulbs. They are also receiving considerable attention as a promising display means such as electronic display boards because of the high brightness and low power consumption. LEDs emit light of different colors depending on the type of compound semiconductor materials used (e.g., gallium phosphide (GaP) or gallium arsenide (GaAs)). In particular, LEDs emitting red or green light have been widely used in various industrial applications as well as in home electronic appliances for over several decades.

LEDs are classified into top-emitting light-emitting diodes (TLEDs) and flip-chip LEDs (FCLEDs) depending on the direction in which light exits. In commonly used TLEDs, light exits through a p-electrode forming an ohmic contact with a p-type compound semiconductor layer. The p-electrode is typically formed of nickel (Ni)/gold (Au) on the p-type compound semiconductor layer. However, a TLED using a semi-transparent Ni/Au p-electrode has a low light utilization efficiency and low brightness. In a FCLED, light generated in an active layer is reflected by a reflective electrode and the reflected light is emitted through a substrate. The reflective electrode is made of a highly light reflective material such as silver (Ag), aluminum (Al), or rhodium (Rh). The FCLED using the reflective electrode can provide a high light utilization efficiency and high brightness.

A conventional n-electrode in a LED or LD is made of an Al—Ti based material that should be annealed at a high temperature above 600° C. In particular, the Al—Ti based material has difficulty in forming an ohmic contact on an N-polar surface of a freestanding GaN substrate. More specifically, conventionally Ti/Al or Al/Ti are deposited on the GaN substrate and then are annealed at high temperature above 600° C. to form an ohmic contact to an n-electrode. However, annealing at high temperature above 600° C. may cause thermal damage to layers formed in a stack before annealing. To prevent this problem, conventionally an n-electrode is formed on a GaN substrate before forming thereon an n-type compound semiconductor layer, an active layer, a p-type compound semiconductor layer, and a p-electrode. As described above, another drawback of an Al—Ti based material is that it can form an ohmic contact only on a Ga-polar surface. It has been known that the Al—Ti based material has difficulty in forming an ohmic contact on the N-polar surface. Thus, to overcome these problems, there is an urgent need to develop an n-electrode material that can improve the characteristics of ohmic contact to the n-electrode and improve the structure of the n-electrode.

SUMMARY OF THE DISCLOSURE

The present invention may provide a nitride-based compound semiconductor device with improved characteristics of ohmic contact to an n-electrode and a method of fabricating the same.

According to an aspect of the present invention, there may be provided a nitride-based compound semiconductor light emitting device including an n-electrode, a p-electrode, an n-type compound semiconductor layer, and an active layer and a p-type compound semiconductor layer formed between the n-electrode and the p-electrode. The n-electrode includes: a first electrode layer formed of at least one element selected from the group consisting of Pd, Pt, Ni, Co, Rh, Ir, Fe, Ru, Os, Cu, Ag, and Au; and a second electrode layer formed on the first electrode layer using a conductive material containing at least one element selected from the group consisting of Ti, V, Cr, Zr, Nb, Hf, Ta, Mo, W, Re, Ir, Al, In, Pb, Ni, Rh, Ru, Os, and Au.

The n-electrode is annealed in a temperature range of approximately 200° C. to 900° C. The first electrode layer is formed to a thickness of approximately 1 to 1,000 Å. The p-type compound semiconductor layer includes a p-GaN layer.

The active layer, the p-type compound semiconductor, and the p-electrode may be sequentially formed on a first surface of the n-type compound semiconductor layer and the n-electrode is formed on a second surface thereof. The n-type compound semiconductor layer is an n-GaN layer and a second surface of the n-GaN layer is a Ga-polar surface, an N-polar surface, or a non-polar surface.

The nitride-based compound semiconductor light emitting device further includes a GaN substrate. The n-type compound semiconductor layer, the active layer, the p-type compound semiconductor layer, and the p-electrode may be sequentially formed on a first surface of the GaN substrate and the n-electrode may be formed on a second surface thereof. The second surface of the GaN substrate is a Ga-polar surface, an N-polar surface, or a non-polar surface.

The nitride-based compound semiconductor light emitting device may further include a sapphire substrate. In this instance, the n-type compound semiconductor layer, the active layer, the p-type compound semiconductor layer, and the p-electrode may be sequentially formed on the sapphire substrate and the n-type compound semiconductor layer may have a stepped surface on which the n-electrode is formed.

According to another aspect of the present invention, there may be provided a method of fabricating a nitride-based compound semiconductor light emitting device, including the steps of: preparing a GaN substrate; sequentially forming an n-type compound semiconductor layer, an active layer, a p-type compound semiconductor layer, and a p-electrode on a first surface of the GaN substrate; and forming an n-electrode on a second surface of the GaN substrate.

The step of forming the n-electrode includes the steps of: forming a first electrode layer of at least one element selected from the group consisting of Pd, Pt, Ni, Co, Rh, Ir, Fe, Ru, Os, Cu, Ag, and Au; forming a second electrode layer on the first electrode layer using a conductive material containing at least one element selected from the group consisting of Ti, V, Cr, Zr, Nb, Hf, Ta, Mo, W, Re, Ir, Al, In, Pb, Ni, Rh, Ru, Os, and Au; and annealing the first and second electrode layers.

The second surface of the GaN substrate is a Ga-polar surface, an N-polar surface, or a non-polar surface. The first electrode layer is formed in a thickness of approximately 1 to 1,000 Å. The annealing is performed in a temperature range of approximately 200° C. to 900° C.

The n-type compound semiconductor layer and the p-type compound semiconductor layer may include an n-GaN layer and a p-GaN layer, respectively.

The present invention can provide a nitride-based compound semiconductor light emitting device with improved characteristics of ohmic contact to the n-electrode.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

Figure 1:
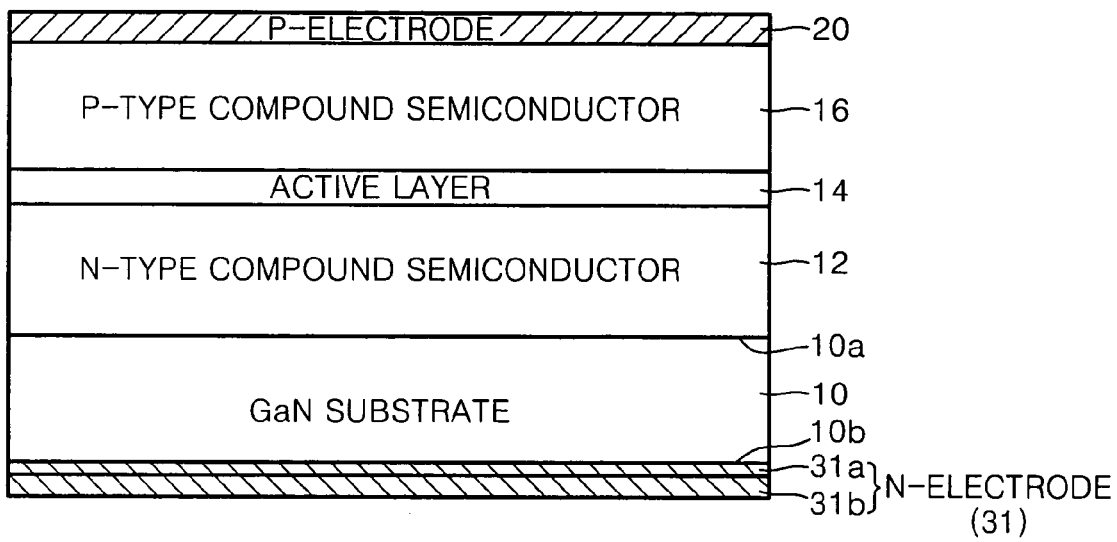
FIG. 1 is a schematic cross-sectional view of a nitride-based compound semiconductor light emitting device according to an embodiment of the present invention.

A nitride-based compound semiconductor light emitting device and a method of fabricating the same according to exemplary embodiments of the present invention will now be described in detail with reference to the accompanying drawings. In the drawings, the thicknesses of layers and regions are exaggerated for clarity.

FIG. 1 is a schematic cross-sectional view of a nitride-based compound semiconductor light emitting device according to an embodiment of the present invention. Referring to FIG. 1, the nitride-based compound semiconductor light emitting device according to the current embodiment of the present invention includes an n-electrode 31, a p-electrode 20, and a n-type compound semiconductor layer 12, an active layer 14 and a p-type compound semiconductor layer 16 formed between the n-electrode 31 and the p-electrode 20. More specifically, the n-type compound semiconductor layer 12, the active layer 14, the p-type compound semiconductor layer 16, and the p-electrode 20 are sequentially formed on a first surface 10a of a GaN substrate 10. The n-electrode 31 is formed on a second surface 10b of the GaN substrate 10 and includes a first electrode layer 31a formed of at least one element selected from the group consisting of Pd, Pt, Ni, Co, Rh, Ir, Fe, Ru, Os, Cu, Ag, and Au and a second electrode layer 31b formed on the first electrode layer 31b using a conductive material containing at least one element selected from the group consisting of Ti, V, Cr, Zr, Nb, Hf, Ta, Mo, W, Re, Ir, Al, In, Pb, Ni, Rh, Ru, Os, and Au. The second electrode layer 31b may have a multilayer structure such as Ti/Al or Al/Ti layer. The n-electrode 31 is annealed at temperature of approximately 200° C. to 900° C. The first electrode layer 31a may be formed in a thickness of approximately 1 to 1,000 Å. The second surface 10b of the GaN substrate 10 may be a Ga-polar surface, an N-polar surface, or a non-polar surface.

The material of the first electrode layer 31a such as Pd, Pt, Ni, Co, Rh, Ir, Fe, Ru, Os, Cu, Ag, or Au is highly reactive with the second surface 10b of the GaN substrate 10. For example, when the first and second electrode layers 31a and 31b are formed of Pd and Ti/Al, respectively, Pd reacts with Ga on the GaN substrate 10 to form Pd-gallide while Ti or Al reacts with N on the GaN substrate 10 to form AlN or TiN. Thus, characteristics of ohmic contact to the n-electrode 31 can be improved. In particular, the n-electrode 31 has excellent ohmic contact characteristics on the Ga-polar surface as well as on the N-polar surface that are conventionally known to have difficulty in forming an ohmic contact. The material of the n-electrode 31a is also highly reactive to form a uniform ohmic contact when the width of a contact dimension is small.

Because the annealing temperature for the n-electrode 31 can be reduced to below 600° C. during manufacturing of the nitride-based compound semiconductor light emitting device having the above-mentioned configuration, it is possible to reduce thermal damage to a stack of other layers formed before annealing, i.e., the n-type compound semiconductor layer 12, the active layer 14, the p-type compound semiconductor layer 16, and the p-electrode 20.

The n-type compound semiconductor layer 12 is made of n-GaN based III-V nitride semiconductor material, in particular, n-GaN, or other III-IV compound semiconductor material capable of inducing laser oscillation (lasing). The n-type compound semiconductor layer 12 may include a lower cladding layer (not shown). The lower cladding layer may be made of n-GaN/AlGaN having a predetermined refractive index or other compound semiconductor material capable of inducing lasing.

The active layer 14 may be made of any material capable of inducing lasing, preferably, a material capable of inducing oscillation of a laser with low threshold current and stable transverse mode characteristics. The active layer 14 may be formed of $In_xAl_yGa_{1-x-y}N$ ($0 \leq x \leq 1$, $0 \leq y \leq 1$, and $x+y \leq 1$) that is a GaN-based III-V nitride compound semiconductor material containing a predetermined percentage of Al. The active layer 14 may have a single quantum well (SQW) or multiquantum well (MQW) structure or other known structure.

The p-type compound semiconductor layer 16 may be formed of a p-GaN based III-V nitride semiconductor material, in particular, p-GaN, or other III-IV compound semiconductor material capable of inducing laser oscillation (lasing). The p-type compound semiconductor layer 16 may include an upper cladding layer (not shown). The upper cladding layer may be made of p-GaN/AlGaN having a predetermined refractive index or other compound semiconductor material capable of inducing lasing.

The p-electrode 20 is mainly composed of Ni/Au bilayer formed on the p-type compound semiconductor layer 16 and forms an ohmic contact with the p-type compound semiconductor layer 16.

The nitride-based compound semiconductor light emitting device having the above-mentioned configuration according to the present invention can provide improved characteristics of the ohmic contact to the n-electrode 31 and output power characteristics. While in the above description, the GaN substrate 10 and the n-type compound semiconductor layer 12 are separate independent components, the GaN substrate 10 may be incorporated into the n-type compound semiconductor layer 12. In this instance, an active layer, a p-type semiconductor layer, and a p-electrode may be sequentially formed on a first surface of an n-type compound semiconductor layer while an n-electrode may be formed on a second surface of the n-type compound semiconductor layer.

Figure 2:
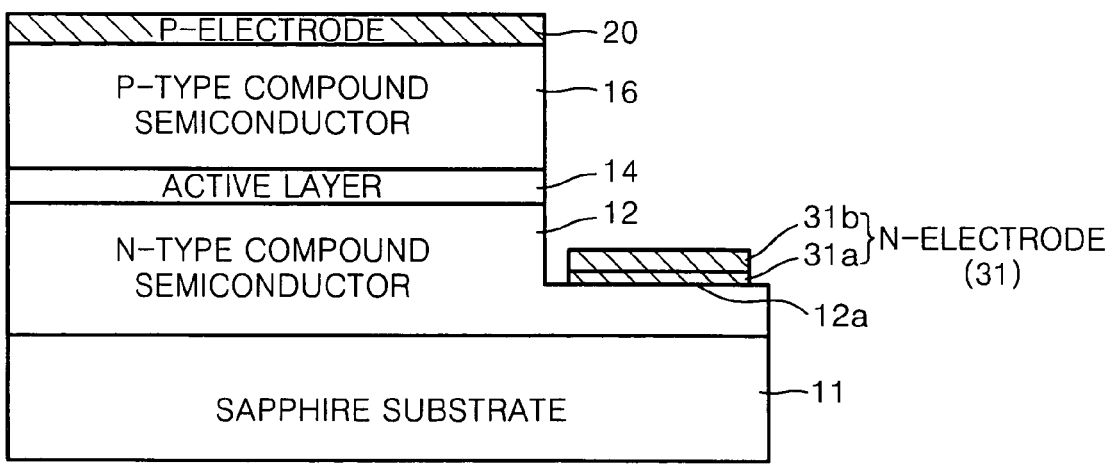
FIG. 2 is a schematic cross-sectional view of a nitride-based compound semiconductor light emitting device according to another embodiment of the present invention.

FIG. 2 is a schematic cross-sectional view of a nitride-based compound semiconductor light emitting device according to another embodiment of the present invention. Like reference numerals in FIGS. 1 and 2 denote like elements, and thus their description is omitted.

Referring to FIG. 2, the nitride-based compound semiconductor light emitting device further includes a sapphire substrate 11, and an n-type compound semiconductor layer 12, an active layer 14, a p-type compound semiconductor layer 16, and a p-electrode 20 sequentially formed on the sapphire substrate 11. The n-type compound semiconductor layer 12 is etched to a predetermined depth to form a stepped surface 12a on one side thereof and the n-electrode 31 is disposed on the stepped surface 12a. The stepped surface 12a of the n-type compound semiconductor layer 12 may be a Ga-polar surface, N-polar surface, or non-polar surface.

FIGS. 3A-3E are flow charts illustrating the steps of a method of fabricating a nitride-based compound semiconductor light emitting device according to an embodiment of the present invention.

Figure 3A:
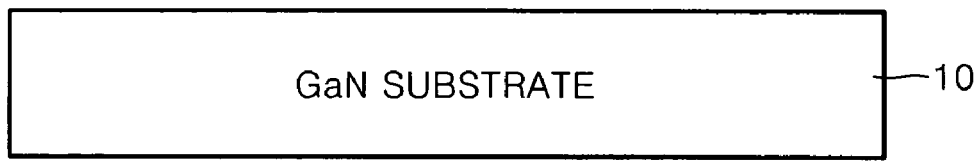
FIGS. 3A-3E are flow charts illustrating the steps of a method of fabricating a nitride-based compound semiconductor light emitting device according to an embodiment of the present invention.
Figure 3B:
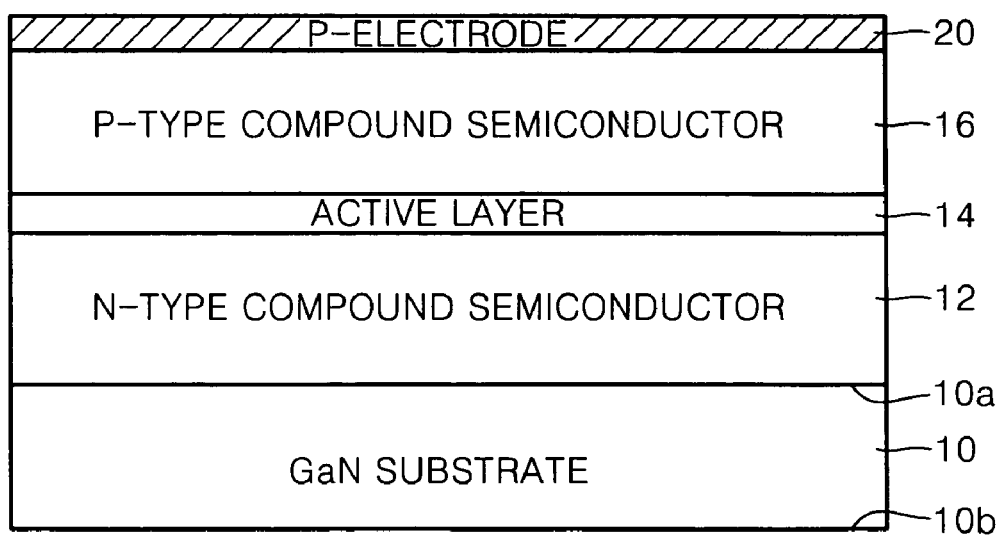

Referring to FIGS. 3A and 3B, the GaN substrate 10 is prepared and an n-type compound semiconductor layer 12, an active layer 14, a p-type compound semiconductor layer 16, and a p-electrode 20 are sequentially formed on a first surface 10a of the GaN substrate 10. Because the n-type compound semiconductor layer 12, the active layer 14, the p-compound semiconductor layer 16, and the p-electrode 20 have the same structures as or are formed of the same materials as described above using commonly known techniques, detailed explanations thereof are not included. For example, each layer may be formed using a thin film deposition technique, such as chemical vapor deposition (CVD), metalorganic CVD (MOCVD), plasma-enhanced CVD (PECVD), or physical vapor deposition (PVD).

Referring to FIGS. 3A-3E, first and second electrode layers 30a and 30b are sequentially formed on a second surface 10b of the GaN substrate 10 and are heat treated using a technique such as annealing to form the n-electrode 31. The second surface 10b of the GaN substrate 10 may be a Ga-polar surface, an N-polar surface, or a non-polar surface.

Figure 3C:
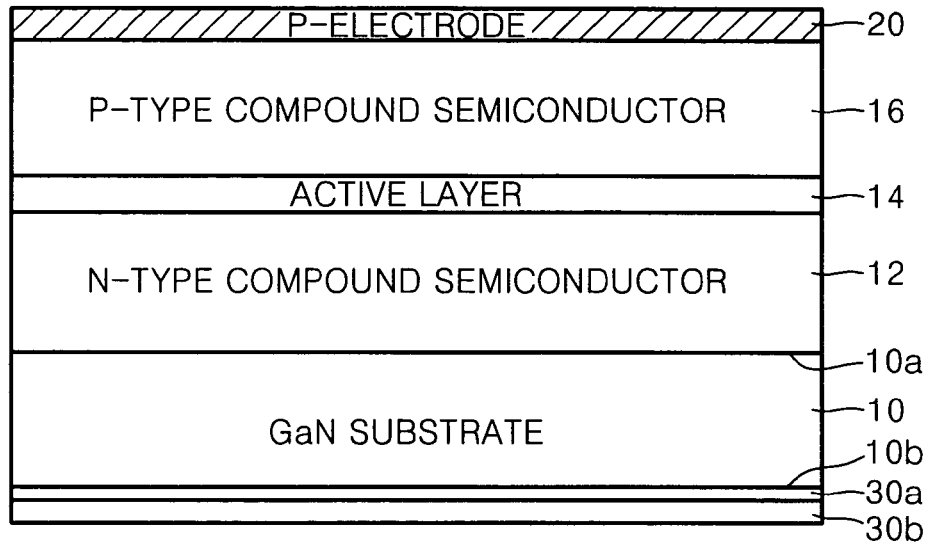

First, referring to FIG. 3C, the first electrode layer 30a is formed of at least one element selected from the group consisting of Pd, Pt, Ni, Co, Rh, Ir, Fe, Ru, Os, Cu, Ag, and Au in a thickness of approximately 1 to 1,000 Å. The second electrode layer 30b may be formed of a conductive material containing at least one element selected from the group consisting of Ti, V, Cr, Zr, Nb, Hf, Ta, Mo, W, Re, Ir, Al, In, Pb, Ni, Rh, Ru, Os, and Au in any thickness. The second electrode layer 30b may have a multi-layer structure. For example, the first and second electrode layers 31a and 31b may be formed of Pd and Ti/Al, respectively.

Figure 3D:
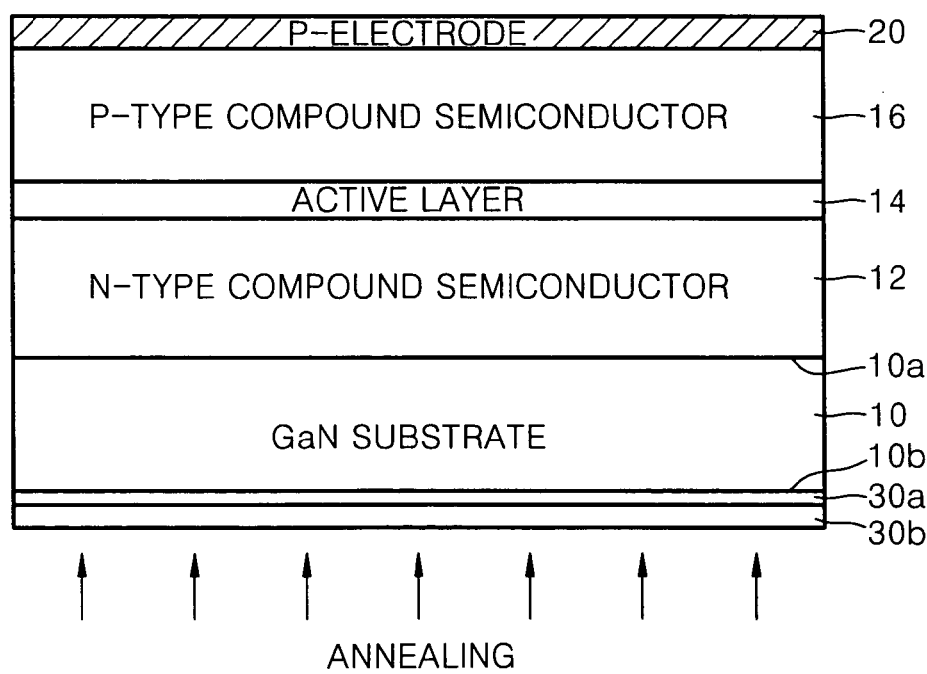
Figure 3E:
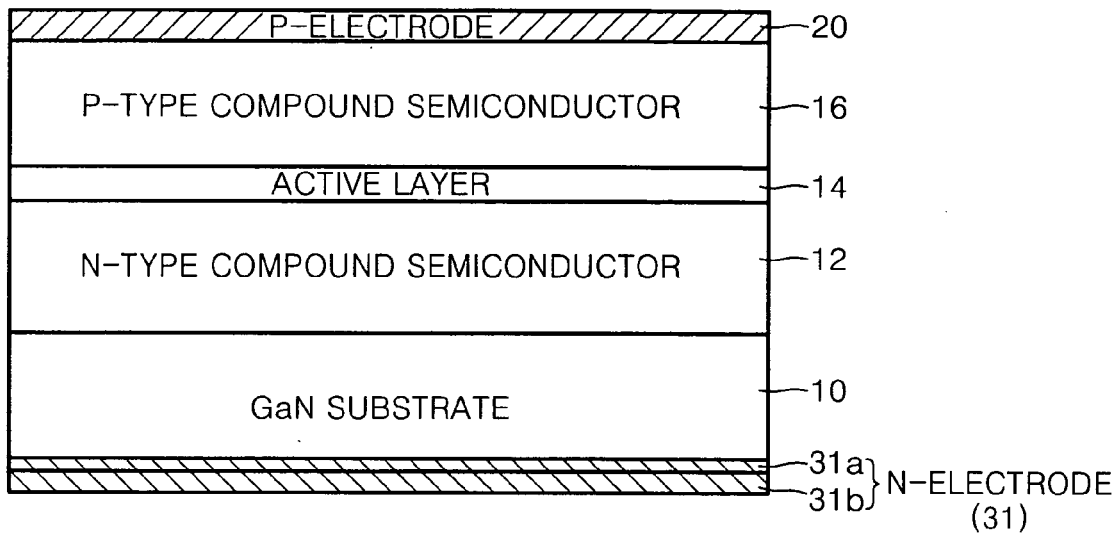

Subsequently, referring to FIGS. 3D and 3E, the first and second electrode layers 30a and 30b are heat treated using annealing to form an n-electrode 31 having improved ohmic contact characteristics. While the annealing can be performed in the temperature range of approximately 200° C. to 900° C., it may be performed in a lower temperature range, e.g., approximately 200° C. to 600° C.

Because annealing temperature of the n-electrode 31 can be reduced to below 600° C. during manufacturing of the nitride-based compound semiconductor light emitting device, it is possible to reduce thermal damage to a stack of other layers formed before annealing, i.e., the n-type compound semiconductor layer 12, the active layer 14, the p-type compound semiconductor layer 16, and the p-electrode 20. This enables the n-type compound semiconductor layer 12, the active layer 14, the p-type compound semiconductor layer 16, and the p-electrode 20 to be sequentially formed on the GaN substrate 10 prior to formation of the n-electrode 31. Thus, it is possible to more readily fabricate the nitride-based compound semiconductor light emitting device than a conventional device.

The nitride-based compound semiconductor light emitting devices and methods of fabricating the same according to embodiments of the present invention can be readily applied to the fabrication of optical devices such as laser diodes (LDs) or light emitting diode (LEDs).

Figure 4:
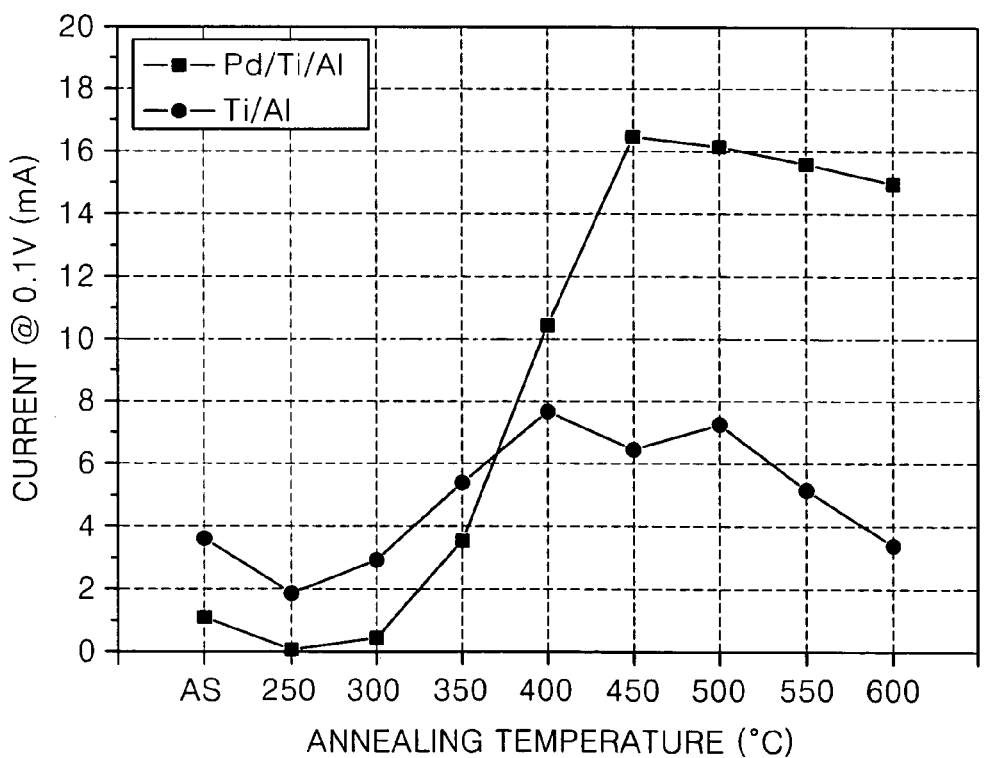
FIG. 4 is a graph illustrating ohmic contact characteristics of a light-emitting diode (LED) using a conventional Ti/Al n-electrode and a LED using a Pd/Ti/Al n-electrode according to the present invention.

FIG. 4 is a graph illustrating ohmic contact characteristics of a GaN LED using a conventional Ti/Al n-electrode and a GaN LED using a Pd/Ti/Al n-electrode according to the present invention. When the n-electrodes are annealed in a low temperature range of approximately 400° C. to 600° C., the LED of the present invention has improved ohmic contact characteristics over the conventional LED.

The present invention can provide a nitride-based compound semiconductor light emitting device with improved characteristics of ohmic contact to an n-electrode. In particular, because the annealing temperature for the n-electrode 31 can be reduced to below 600° C. during manufacturing of the nitride-based compound semiconductor light emitting device having the above-mentioned configuration, thermal damage to a stack of other layers formed before annealing can also be reduced. Thus, because an n-type compound semiconductor layer, an active layer, a p-type compound semiconductor layer, and a p-electrode can be sequentially formed on the GaN substrate 10 prior to formation of the n-electrode 31, it is possible to more easily fabricate the nitride-based compound semiconductor light emitting device than a conventional device.

In the present invention, the n-electrode 31 has excellent ohmic contact characteristics on a Ga-polar surface as well as on an N-polar surface that is typically known to have difficulty in forming an ohmic contact. In particular, the material of the n-electrode is also highly reactive to form a uniform ohmic contact when the width of a contact dimension is small. The nitride-based compound semiconductor light emitting devices and methods of fabricating the same according to embodiments of the present invention can be readily applied to the fabrication of optical devices such as LDs or LEDs.

While the present invention has been particularly shown and described with reference to exemplary embodiments thereof to aid in the understanding thereof, the embodiments are presented by way of example, not as a limitation. The present invention is not limited to the structure and arrangements described and shown above. That is, it will be understood by those of ordinary skill in the art that various changes in form and details may be made therein without departing from the spirit and scope of the present invention as defined by the following claims.

What is claimed is:

1. A nitride-based compound semiconductor light emitting device including:
   an n-electrode,
   a p-electrode, and
   an n-type compound semiconductor layer, an active layer and a p-type compound semiconductor layer respectively formed between the n-electrode and the p-electrode,
   wherein the n-electrode comprises:
   a first electrode layer formed of at least one element selected from the group consisting of Ir, Fe, Ru, and Os, and
   a second electrode layer formed on the first electrode layer using a conductive material containing at least one element selected from the group consisting of V, Nb, Hf, Re, and Pb,
   wherein the first electrode layer of the n-electrode directly or indirectly contacts the n-type compound semiconductor layer and the first electrode layer is disposed between the second electrode layer and the n-type compound semiconductor layer,
   wherein the n-electrode is disposed closer to the n-type compound semiconductor layer than the p-type compound semiconductor layer, and
   wherein the first electrode layer and the second electrode layer are sequentially stacked on the n-type compound semiconductor layer.

2. The device of claim 1, wherein the n-electrode is annealed in a temperature range of approximately 200° C. to 900° C.

3. The device of claim 1, wherein the active layer, the p-type compound semiconductor, and the p-electrode are sequentially formed on a first surface of the n-type compound semiconductor layer, and
   wherein the n-electrode is formed on a second surface of the n-type compound semiconductor layer.

4. The device of claim 3, wherein the n-type compound semiconductor layer is an n-GaN layer.

5. The device of claim 4, wherein the second surface of the n-GaN layer is a Ga-polar surface, N-polar surface, or non-polar surface.

6. The device of claim 1, further comprising a GaN substrate,
   wherein the n-type compound semiconductor layer, the active layer, the p-type compound semiconductor layer, and the p-electrode are sequentially formed on a first surface of the GaN substrate, and the n-electrode is directly formed on a second surface of the GaN substrate, the second surface being opposite to the first surface.

7. The device of claim 6, wherein the second surface of the GaN substrate is a Ga-polar surface, N-polar surface, or non-polar surface.

8. The device of claim 1, further comprising a sapphire substrate,
   wherein the n-type compound semiconductor layer, the active layer, the p-type compound semiconductor layer, and the p-electrode are sequentially formed on the sapphire substrate, and
   wherein the n-type compound semiconductor layer has a stepped surface and the n-electrode is formed on the stepped surface.

9. The device of claim 8, wherein the n-type compound semiconductor layer is an n-GaN layer.

10. The device of claim 9, wherein the stepped surface of the n-GaN layer is a Ga-polar surface, an N-polar surface, or a non-polar surface.

11. The device of claim 1, wherein the first electrode layer is formed to a thickness of approximately 1 to 1,000 Å.

12. The device of claim 1, wherein the p-type compound semiconductor layer includes a p-GaN layer.

13. A nitride-based compound semiconductor light emitting device comprising:
    an n-electrode;
    a p-electrode; and
    an n-type compound semiconductor layer, an active layer and a p-type compound semiconductor layer respectively formed between the n-electrode and the p-electrode,
    wherein the n-electrode comprises:
    a first electrode layer formed of at least one element selected from the group consisting of Co, Rh, Ir, Fe, Ru, Os, Cu, and Ag, and
    a second electrode layer formed on the first electrode layer using a conductive material containing at least one element selected from the group consisting of Re and Pb,
    wherein the first electrode layer of the n-electrode directly or indirectly contacts the n-type compound semiconductor layer and the first electrode layer is disposed between the second electrode layer and the n-type compound semiconductor layer,
    wherein the n-electrode is disposed closer to the n-type compound semiconductor layer than the p-type compound semiconductor layer, and
    wherein the first electrode layer and the second electrode layer are sequentially stacked on the n-type compound semiconductor layer.

14. The device of claim 13, wherein the n-electrode is an annealed element which is annealed in a temperature range of approximately 200° C. to 600° C.

* * * * *